United States Patent [19]
Ouchi

[11] 3,995,264

[45] Nov. 30, 1976

[54] APPARATUS FOR ENCODING AND DECODING BINARY DATA IN A MODIFIED ZERO MODULATION DATA CODE

[75] Inventor: Norman Ken Ouchi, San Jose, Calif.

[73] Assignee: International Business Machines Corporation, Armonk, N.Y.

[22] Filed: Nov. 1, 1974

[21] Appl. No.: 519,951

[52] U.S. Cl. ................. 340/347 DD; 340/146.1 AB
[51] Int. Cl.² ..................... H03K 13/24; H04L 3/00
[58] Field of Search............ 340/347 DD, 146.1 AB; 360/41; 325/38 R, 38 A

[56] References Cited
UNITED STATES PATENTS 3,631,471  12/1971  Griffiths ...................... 340/347 DD
3,810,111  7/1974  Patel ....................... 340/347 DD X

*Primary Examiner*—Thomas J. Sloyan
*Attorney, Agent, or Firm*—N. N. Kallman

[57] ABSTRACT

An apparatus for processing data employs a modification of a zero modulation code. The zero modulation code has a waveform that is symmetrical about a zero signal level within narrow defined limits. Each data digit, 1 or 0, is encoded into two NRZI digits. A relaxed run length limitation allows use of a $(d,k)$ code of $(1,4)$, where $(d)$ is the minimum number of 0 digits between 1 digits and $(k)$ is the maximum number of 0 digits between 1 digits, without violating the frequency and charge constraints. Only five charge states and only one bit lookahead is needed in order to encode data in the $(1,4)$ code.

8 Claims, 11 Drawing Figures

MZDC STATE DIAGRAM

| DATA DIGIT $d_0$ | TRANSITION PATTERN $a_0\ b_0$ | CONDITIONS |
|---|---|---|
| 0 | (0 0) | PREVIOUS DIGIT $d_{-1}=1$, ENCODED(01) |
|   | (1 0) | OTHERWISE THAN ABOVE |
| 1 | (1 0) | P(B) = 1 & NEXT DIGIT $d_{+1} = 1$ & NOT (PREVIOUS DIGIT $d_{-1}= 1$ & ENCODED (1 0)) |
|   | (0 0) | PREVIOUS DIGIT $d_{-1}= 1$ & ENCODED (1 0) |
|   | (0 1) | OTHERWISE THAN CONDITIONS FOR (10) AND (00) |

FIG. 3

MZDC DECODING

| DATA DIGIT $d_0$ | TRANSITION PATTERN $a_0\ b_0$ | CONDITIONS |
|---|---|---|
| 1 | (0 0) | $a_{-1}b_{-1}$ PREVIOUS PATTERN = (10) |
| 0 |   | OTHERWISE THAN ABOVE |
| 1 | (1 0) | $a_{+1}b_{+1}$ NEXT PATTERN = (00) |
| 0 |   | OTHERWISE THAN ABOVE |
| 1 | (0 1) | ALWAYS |

FIG. 4

STARTING FROM INITIAL STATE B

| DATA | | 0 | 0 | 1 | 0 | 0 | 0 | 1 | 1 | 0 | 0 | 1 | 0 | 0 | 0 |
|---|---|---|---|---|---|---|---|---|---|---|---|---|---|---|---|
| STATE | B | C | B | E | C | B | C | D | C | B | C | A | B | C | B |
| CODE | | (1 0) | (1 0) | (0 1) | (0 0) | (1 0) | (1 0) | (1 0) | (0 0) | (1 0) | (1 0) | (0 1) | (0 0) | (1 0) | (1 0) |
| PB | | 0 | 1 | 0 | 0 | 1 | 0 | 1 | 1 | 1 | 0 | 1 | 1 | 0 | 1 |
| RELATIVE ACCUMULATED CHARGE | 0 | +2 | 0 | 0 | +2 | 0 | +2 | 0 | +2 | 0 | +2 | 0 | -2 | 0 | +2 |

FIG. 5

ENCODING EXAMPLE

INPUT DATA = 1 1 0 0 0 1 1 1 0 0 1 1 0 0

FF 3,4,5,6 = 0 INITIALLY

| FF | | | | | | | | | LOGIC | | | | | OUTPUT SEQUENCE |
|---|---|---|---|---|---|---|---|---|---|---|---|---|---|---|
| 1 | 2 | 3 | 4 | 5 | $\overline{6}$ | 7 | 8 | 14 | $\overline{9}$ | 10 | 11 | 13 | 15 | 12 |
| $d_{+1}$ | $d_0$ | $d_{-1}$ | PB | $a_{-1}$ | $b_{-1}$ | | | | | | | | | a b |
| 1 | 1 | 0 | 0 | 0 | 1 | 0 | 0 | 1 | 1 | 0 | 0 | 0 | b | 0 1 |
| 0 | 1 | 1 | 0 | 0 | 0 | 0 | 0 | 1 | 1 | 0 | 0 | b | b | 0 1 |
| 0 | 0 | 1 | 0 | 0 | 0 | 1 | 0 | 0 | 1 | 0 | 0 | 0 | 0 | 0 0 |
| 0 | 0 | 0 | 1 | 0 | 1 | 0 | 1 | 0 | 1 | a | 0 | 0 | 0 | 1 0 |
| 1 | 0 | 0 | 0 | 1 | 1 | 1 | 1 | 0 | 1 | a | 0 | 0 | 0 | 1 0 |
| 1 | 1 | 0 | 1 | 1 | 1 | 1 | 1 | 0 | 1 | 0 | a | 0 | 0 | 1 0 |
| 1 | 1 | 1 | 1 | 1 | 1 | 1 | 0 | 0 | 0 | 0 | 0 | 0 | 0 | 0 0 |
| 0 | 1 | 1 | 1 | 0 | 1 | 1 | 0 | 1 | 1 | 0 | 0 | b | 0 | 0 1 |
| 0 | 0 | 1 | 1 | 0 | 0 | 0 | 0 | 0 | 1 | 0 | 0 | 0 | 0 | 0 0 |
| 1 | 0 | 0 | 0 | 0 | 1 | 1 | 1 | 0 | 1 | a | 0 | 0 | 0 | 1 0 |
| 1 | 1 | 0 | 1 | 1 | 1 | 1 | 1 | 0 | 1 | 0 | a | 0 | 0 | 1 0 |
| 0 | 1 | 1 | 1 | 1 | 1 | 1 | 0 | 0 | 0 | 0 | 0 | 0 | 0 | 0 0 |
| 0 | 0 | 1 | 1 | 0 | 1 | 0 | 1 | 0 | 1 | a | 0 | 0 | 0 | 1 0 |
| 0 | 0 | 0 | 0 | 1 | 1 | 1 | 1 | 0 | 1 | a | 0 | 0 | 0 | 1 0 |

INPUT DATA = 1 1 0 0 0 1 1 1 0 0 1 1 0 0

ENCODED DATA SEQUENCE = (0 1)(0 1)(0 0)(1 0)(1 0)(1 0)(0 0)(0 1)(0 0)(1 0)(1 0)(0 0)(1 0)(1 0)

FIG. 8

DECODING EXAMPLE

ENCODED DATA = $a_0 b_0$    FF $b_{-1}$ = 1 INITIALLY (0 1)(0 1)(0 0)(1 0)(1 0)(1 0)(0 0)(0 1)(0 0)(1 0)(1 0)(0 0)(1 0)(1 0)(X X)

| | | FF | | | DECODED LOGIC | | | OUTPUT DATA |
|---|---|---|---|---|---|---|---|---|
| $b_{-1}$ | $a_0$ | $b_0$ | $a_{+1}$ | $b_{+1}$ | | | | |
| 16 | 17 | 18 | 19 | 20 | 21 | 23 | 22 | 24 |
| 1 | (0 | 1) | (0 | 1) | 0 | 1 | 0 | 1 |
| 1 | (0 | 1) | 0 | 0 | 0 | 1 | 1 | 1 |
| 1 | (0 | 0) | 1 | 0 | 0 | 0 | 0 | 0 |
| 0 | (1 | 0) | 1 | 0 | 0 | 0 | 0 | 0 |
| 0 | (1 | 0) | 1 | 0 | 0 | 0 | 0 | 0 |
| 0 | (1 | 0) | 0 | 0 | 0 | 0 | 1 | 1 |
| 0 | (0 | 0) | 0 | 1 | 1 | 0 | 0 | 1 |
| 0 | (0 | 1) | 0 | 0 | 1 | 1 | 1 | 1 |
| 1 | (0 | 0) | 1 | 0 | 0 | 0 | 0 | 0 |
| 0 | (1 | 0) | 1 | 0 | 0 | 0 | 0 | 0 |
| 0 | (1 | 0) | 0 | 0 | 0 | 0 | 1 | 1 |
| 0 | (0 | 0) | 1 | 0 | 1 | 0 | 0 | 1 |
| 0 | (1 | 0) | 1 | 0 | 0 | 0 | 0 | 0 |
| 0 | (1 | 0) | | | 0 | 0 | 0 | 0 |

ENCODED DATA = (0 1)(0 1)(0 0)(1 0)(1 0)(1 0)(0 0)(0 1)(0 0)(1 0)(1 0)(0 0)(1 0)(1 0)

DATA =    1  1  0  0  0  1  1  1  0  0  1  1  0  0

FIG. 9

APPARATUS FOR ENCODING AND DECODING BINARY DATA IN A MODIFIED ZERO MODULATION DATA CODE

BACKGROUND OF THE INVENTION

1. Field of the Invention

This invention relates to a novel and improved apparatus for processing binary data employing a modified zero modulation data code.

2. Description of the Prior Art

Run length limited (RLL) codes employing variable length words are known in the art, such as is disclosed in U.S. Pat. No. 3,689,899 to P. A. Franaszek. The RLL code is one in which succeeding binary 1's of each encoded bit sequence are separated by no fewer than a $(d)$ number, and no more than a $(k)$ number of binary 0's, the choice of $(d)$ and $(k)$ depending upon the specific code that is being used. The coded data is processed in groups or words of variable length, and the lengths of the encoded words have a constant ratio to the respective lengths of their corresponding bit strings, thus ensuring a constant data transmission or data recording rate.

One type of RLL code is a zero modulation (ZM) code that is disclosed in U.S. Pat. No. 3,810,111 filed in behalf of A. Patel, entitled "Data Coding With Stable Base Line for Recording and Transmitting Binary Data." The ZM code is useful in a circuit that employs an element which is sensitive to a DC signal component, and when there is an imbalance of polarity. Elements of this type are capacitors and inductors that are used as integrators or transformers, and which experience a charging, or increase of voltage or current. The "charge" has a tendency to degenerate or level off, resulting in nonlinear variations in the clock and data signal waveforms, with resultant degradation of the data signal and loss of synchronism.

The ZM code overcomes this problem. In the ZM code, each data digit is encoded as a pair of binary digits, and the binary digit pair is converted to an NRZI waveform. The ZM encoding as described in the Patel patent allows no more than three successive 0 digits between succeeding 1 digits, and a clock transition is produced in at least one of every two adjacent digit periods.

Also backward and lookahead parity functions are used to determine whether a particular sequence of data digits is to be encoded. For such purpose, a network requiring an $(n)$ number of bits lookahead is used, with parity bits inserted for every number of $(n)$ bits.

It would be desirable to have a system that employs a ZM code with all its attendant advantages, but with lesser constraints and with less complex and less expensive hardware.

SUMMARY OF THE INVENTION

An object of this invention is to provide an improved encoding apparatus employing a zero modulation run length limited (1,4) code. Another object of the invention is to provide a decoding apparatus for such a code.

Another object of this invention is to provide a zero modulation encoder that requires only a one bit lookahead during encoding, and thus allows the use of less and simpler hardware.

In accordance with this invention, there is provided apparatus for encoding a sequence of binary data digits in a modified zero modulation code which employs a $(d,k)$ limitation of $(1,4)$ wherein a maximum of four binary 0's may be interposed between succeeding binary 1's. However, the code sequence 10001 is not repeated, without an intervening sequence of a shorter run length of binary 0's. Each digit D of a word is represented by two binary bits (ab). In keeping with this invention, encoding of data requires as inputs the present, previous, and next data bits, and a backward zero parity; and decoding requires the concurrent availability of the present, previous, and next pairs of bits, with a delay of only 1 bit.

BRIEF DESCRIPTION OF THE DRAWING

The invention will be described in greater detail with reference to the drawings in which:

FIG. 3 is a table indicating possible transition patterns and conditions for the 0 digit and 1 digit, as used for encoding;

FIG. 4 is a table indicating possible transition patterns and conditions for the 0 digit and 1 digit, as used for decoding;

FIG. 5 is a representation of a data sequence, illustrating the state branching, the transition digit pairs encoded, the P(B) parity function, and the relative accumulated charge;

FIG. 8 is a tabular representation of data flow and logic conditions, for a given encoding example, as related to the encoder depicted in FIG. 6; and FIG. 9 is a tabular representation of data flow and logic conditions, for the decoding of the encoded data of FIG. 8 by means of the decoder of FIG. 7.

DESCRIPTION OF THE PREFERRED EMBODIMENT

Figure 1:
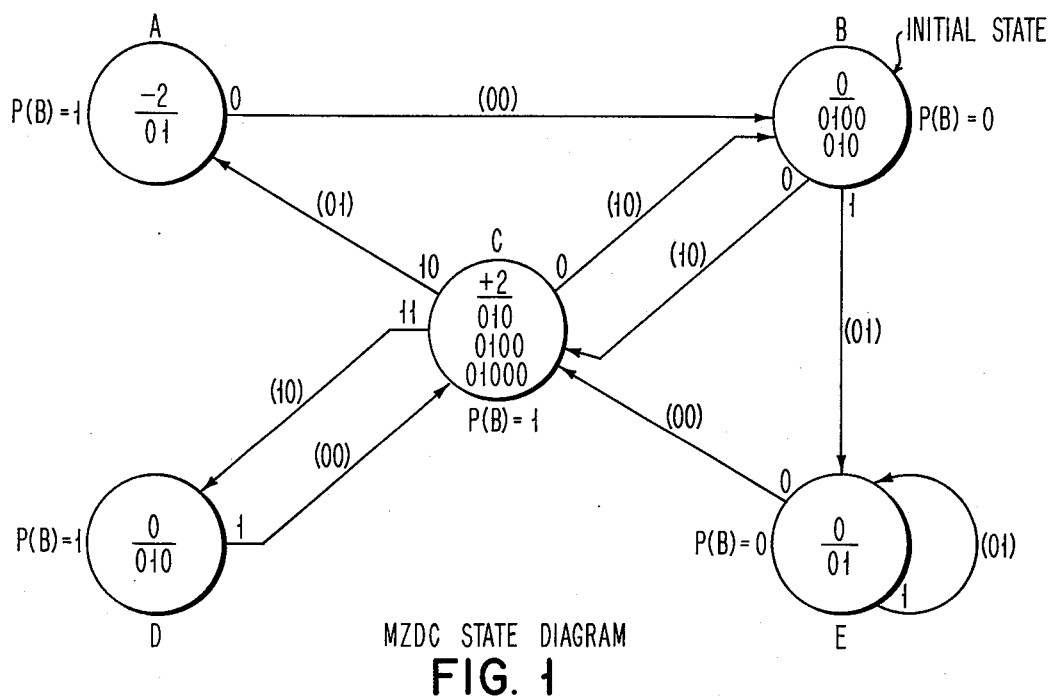
FIG. 1 is a state diagram illustrating the five charge states employed for modified zero modulation (MZDC), in accordance with this invention.

FIG. 1 is a so called "state diagram," the principles of which are more fully explained in the above referred to U.S. Pat. No. 3,810,111 to Patel. The state diagram of FIG. 1 includes five possible states or nodes, represented by circles A through E, inclusive. The upper notation within each circle, 0, +2 or −2, indicates the magnitude of stored charge that is accumulated over a given time interval. This accumulated charge appears at the output of the encoding logic, and is applied to an integration circuit 30, which may include either a charging capacitor, or a transformer, or for example, an inductive coil coupled to a magnetic transducer used for recording signals on a magnetic medium. With the MZDC system disclosed herein, the maximum number of units of charge that is accumulated for any data bit period is never more than ± 2. FIGS. 2a–c provide representations of charge accumulations $S_N$ which occur with paired binary digits (10), (01), and (00), respectively. $S_{N-1}$ represents the magnitude of the accumulated charge that existed just prior to the appearance of the first digit of the pair $S_N$.

The lower digits below the horizontal line in each circle of FIG. 1 delineate the possible ending or previous pattern expressed as binary digits. This pattern is indicative of the number of 0 digits that follow a previous 1 digit.

Between each state are branches that lead to a next possible state, determined by the present encoded pattern and the next pattern to be encoded. The system is always started in an initial state, which is State B. At such time, there is no data recorded and no accumulated charge. To start, any ending coded pattern may be used, except (00).

From the B state, a branch may be made to State C if data digit 0 is to be encoded, or to State E, if data digit 1 is to be encoded. In this branching, to encode the data digit 0, digit pair (10) is used; whereas if data digit 1 is to be encoded, digit pair (01) is used.

If in the E state, a data digit 1 will maintain the system in the same state. However, a data digit 0 will cause branching to State C, and will be coded as a digit pair (00).

From the C state, branches are available to States A, B, and D. In State C, the feature of one bit look ahead is made available. In the other four states, we only examine the data digit to be encoded to determine the next state. However, in State C, if the first data digit is a one, we examine two data digits, namely, the data digit 1 to be encoded and the succeeding data digit. When in State C, two data digits may be sensed in the storage register (described hereinafter with reference to FIGS. 6 and 7), as combinations of data digits 10 or 11. For 10 data, the branch leads to State A, and digit pair (01) is encoded. For 11 data, the branch leads to State D, and digit pair (10) is encoded. For a 0 data digit, the branch is made to State B and digit pair (10) is encoded.

From the A state entered by encoding the 1 data of 10 data, the only branch out is the encoding of data digit 0 as digit pair (00). The encoding of a data digit 1 while in State A is forbidden, since the one bit look ahead insured that only a 0 data digit would be encoded. The only branch out from State A leads to initial State B.

From the D state, entered by encoding the 1 data of 11 data, the single branch out is the encoding of a data digit 1 as digit pair (00). The encoding of a data digit 0 is forbidden, since the one bit look ahead insured that only a 1 data digit could be encoded. The branch from State D leads back to State C.

The rules of encoding and decoding that are followed by the apparatus of this invention are set forth in tabular form in FIGS. 3 and 4 respectively. To encode a data digit 0, either a transition pattern or digit pair ($a_0b_0$) of (00) or (10) may be used. The (00) digit pair is encoded, if the previous data digit $d_{-1}$ was a 1, that was encoded, as (01). If not, then digit pair (10) is encoded. To encode a data digit 1, one of the transition patterns (10) or (00) or (01) is generated. The conditions for generating one of these particular digit pairs are recited in the table of FIG. 3.

It should be noted that the function P(B) refers to the backward zero parity which is determined by the number of 0 data digits that were encoded prior to the instant digit to be encoded. Thus, to arrive at a transition pattern of (10) for a data digit 1, parity P(B) must be 1. This parity condition exists at States A, C and D, but not at States B and E, which have zero parity. States B and E change to State C when a data digit 0 is encoded.

FIG. 4 provides a decoding table for the three types of transition patterns that are encoded. Digit pair (01) always decodes to a data digit 1. The other digit pairs decode to data digit 1 or 0, depending upon the pattern that precedes or follows the present transition pattern that is being decoded. Thus, a coded transition pattern (10) (00) will always be decoded to data digits 11.

FIG. 5 is an exemplary illustration of the encoding of an arbitrary binary data sequence, showing the progression from initial State B to the other states, determined by the arrangement of data digits. The coded digit pairs ($a_0b_0$) are generated as specified along the "Code" line, and the parity function P(B) associated with each state is shown. In addition, the amount of charge units, +2, −2 or 0, is indicated for each state in FIG. 5.

Figure 2:
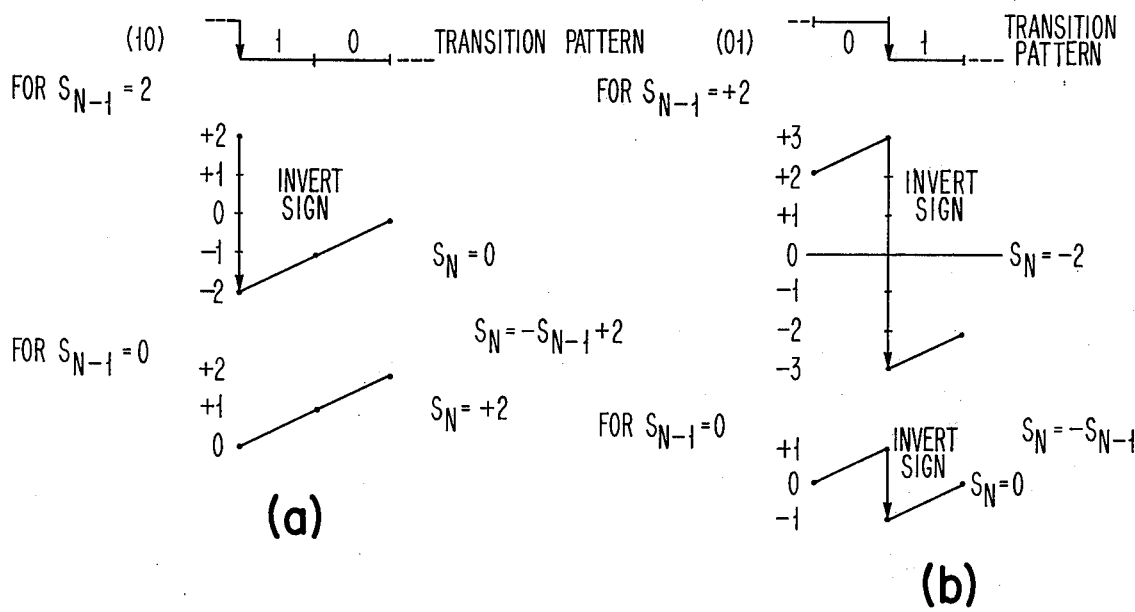
FIGS. 2a–c are representations of stored charge levels for different digit pairs, as used in this invention.
Figure 6:
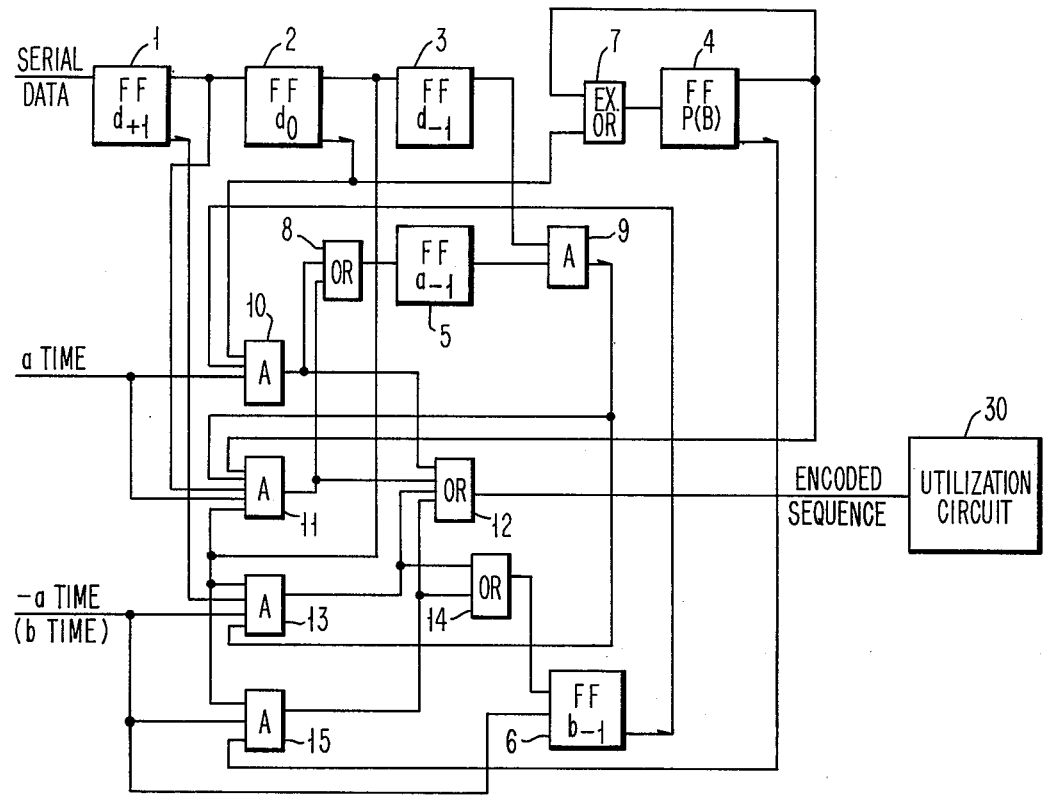
FIG. 6 is a logic circuit diagram of an encoder to implement the MZDC encoding of this invention.

In FIG. 6, an encoding logic network used to implement this invention receives serial data at the input of a flip-flop (FF) 1, which is the first stage $d_{+1}$ of a storage register. The input data is received serially, and each data digit or bit is fed to the first FF1 (bistable multi-vibrator) in response to an oscillator clock operating at the data frequency. For each bit fed to FF1 the stored bits or data digits are shifted to successive FF2 and FF3, as is well known in the art. A similar clocking and shifting arrangement is shown in FIG. 2 of the above referred to U.S. Pat. No. 3,810,111 to Patel. Clock input pulses designated as "$a$ time," and "$-a$ time" (or "$b$ time"), are derived from the oscillator clock, and operate at twice the data frequency. The $a$ and $b$ timing pulses are 180° out of phase. All the flip-flops of the logic network are clocked at the data frequency. Clocking inputs are not shown for flip-flops 1, 2, 3, 4 and 5 which are clocked at the start of "$a$ time" as the data is shifted. An input is shown to flip-flop 6 to indicate that it is clocked at "$b$ time." Flip-flop 4 is always set to the output of EXOR 7 from the previous "$b$ time".

With reference to FIG. 8, an exemplary input data sequence is set forth, and the conditions of flip-flops 1–6, signal inputs to flip-flops 4, 5, 6 from logic Exclusive OR 7, OR gate 8, and OR gate 14 respectively, are indicated. Also, the logic states for AND gates 9, 10, 11, 13 and 15 are indicated for each input stage of data. Under these logic states, the letter (a) designates that the gate is 1 or high when "$a$ time" is active, and similarly $b$ implies that the gate is 1 or high when "$b$ time" is active.

Initially flip-flops 3, 4, 5 and 6 are reset or set at 0. The tabular representation of FIG. 8 indicates the state of the logic blocks 1 through 5 and 7 through 11 of the encoder of FIG. 6 as each data digit is shifted into FF 1 of the storage register at "$a$ time". The state of logic blocks 6, 11, 13, 14 and 15 is given at "$b$ time" and the state of OR gate 12 is given for both $a$ and $b$ times. Thus, looking at the first row of logic states in FIG. 8, flip-flop 3 contains an initializing zero and the first two data digits 11 of the input data sequence are stored in flip-flops 1 and 2. The remainder of the input data is clocked successively into flip-flop 1 as shown in the left hand column of FIG. 8. Data from flip-flops 1 and 2 moves diagonally downward to the right into flip-flops 2 and 3 respectively with each clock pulse as viewed in the table of FIG. 8. By following the logic of FIG. 6 with reference to the table of FIG. 8, it can be seen that each data digit $d$ entered into flip-flop 1 appears as an encoded digit pair, ab, at the output of OR 12. The values $a_0$ and $b_0$ for any input digit $d_0$ are given by the Boolean expressions:

$$a_0 = \overline{d_0} \cdot \overline{b_{-1}} + d_0 \cdot d_{+1} \cdot \overline{d_{-1} \cdot a_{-1}} \cdot P(B)$$

$$b_0 = d_0 \cdot \overline{P(B)} + d_0 \cdot \overline{d_{+1}} \cdot \overline{d_{-1} \cdot a_{-1}};$$

The encoded data digits, seen at the output line labeled as "Encoded Sequence," are recorded in NRZI form by utilization circuit 30 on a storage medium, such as a magnetic disk for example.

Figure 7:
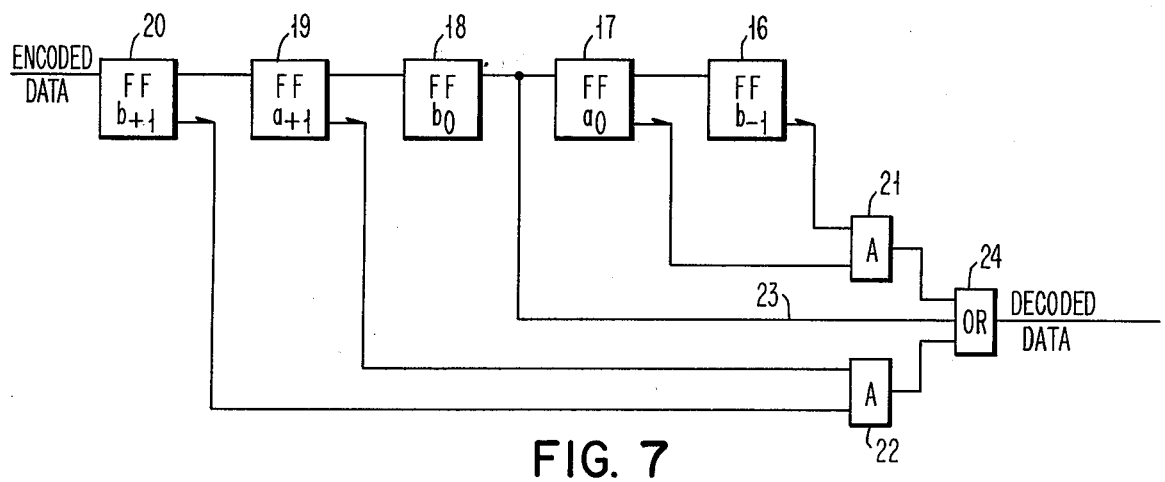
FIG. 7 is a logic circuit diagram of a decoder that implements the MZDC decoding of this invention.

For decoding the recorded data, which is registered as pairs of binary bits on the storage medium, a logic circuit such as shown in FIG. 7 is employed. The encoded data is applied to the first FF 20 of a five-stage storage register, which has at the outputs of the stages, two AND gates 21 and 22. The tabular representation of FIG. 9 indicates the states or conditions of each logic element of the decoder circuit, as the digit pairs are applied to the FF 20 in binary sequence.

The initial condition of the decoder logic circuit requires that FF 16 is reset to the 1 or high state, whereas FF 2, 3, 4 and 5 are reset to 0 or the low state. Decoding starts when the first bit of data to be decoded appears in FF 17. At any given time, when a digit pair $a_0b_0$ is stored in FF 17 and FF 18, the following digit pair $a_{+1}b_{+1}$ is stored in FF 19 and FF 20.

The inputs to AND gates 21 and 22 and OR gate 24 determine the states of these logic elements and thus the output data signal which is translated to decoded data. For example, whenever the digit pair (00) is present in FF 19 and FF 20, then AND gate 22 provides a data 1 output to OR gate 24. Whenever the state of FF 18 is 1 or high, then the output data fed on lead 23 directly to OR gate 24 is a data 1 signal. The flip-flops are clocked at twice the data frequency. In this manner, the encoded data that was recorded is recovered, and decoded at data frequency.

Thus there has been described a system in which only one bit look-ahead is needed for encoding input and which only requires five states for branching. Consequently a reduction in hardware and storage requirements may be realized. This is achieved while preserving a charge constraint of three in the coded data. A slight relaxation of the frequency constraints is necessary whereby four binary 0 digits in a row may appear in the coded data. However, two such sequences of four 0 digits cannot be produced in succession.

What is claimed is:

1. Apparatus for encoding sequentially a plurality of binary data digits $d$ in a run length limited (1,4) code as pairs of associated binary digits ab which take one of the value pairs 10, 01 and 00, the apparatus comprising
    first data digit storage means for receiving the input data digits in sequence and for storing the next data digit $d_{+1}$ to be encoded;
    second data digit storage means for storing the current data digit $d_0$ to be encoded;
    third data digit storage means for storing the previously encoded data digit $d_{-1}$;
    last encoded digit storage means for storing the previous pair $a_{-1} b_{-1}$ of encoded digits;
    condition indicating means for forming a cumulative function of previously encoded data digits to indicate which of a plurality of possible conditions said apparatus is in;
    and encoding logic means connected to said first, second and third data digit storage means, said last encoded digit storage means and said condition indicating means,
    said encoding logic means consisting of primary encoding logic means for encoding said data digits in a predetermined manner as one of said encoded digit pairs ab in dependence only upon the values $d_{-1}, a_{-1}, b_{-1}$, said condition indication and the value of the data digit $d_0$ to be encoded; and lookahead encoding logic means, responsive at least to one predetermined condition indication from said condition indicating means, for encoding a data digit $d_0$ of one value as one of said encoded digit pairs ab when said digit $d_{+1}$ has a first value and as another of said digit pairs ab when said digit $d_{+1}$ has the opposite value;
    whereby all said binary data digits can be encoded with no more than one bit lookahead and with no more than one bit delay in encoding.

2. Apparatus according to claim 1 wherein said condition indicating means includes a parity function generator for generating and storing the parity function P(B) of data digits of one binary value in the previously encoded data digits up to and including the digit $d_{-1}$ last encoded.

3. Apparatus according to claim 2 in which said one binary value from which said parity function is formed is 0.

4. Apparatus according to claim 3 including means for clocking said plurality of binary data digits into said first data digit storage means at one frequency and for shifting the contents of said first data digit storage means into said second data digit storage means and the contents of said second data digit storage means into said third data digit storage means also at said one frequency,
    said means for clocking further causing said logic means to generate the $a$ digit of an encoded digit pair in a first sub-interval subsequent to clocking and shifting of said data digits and to generate the associated $b$ digit of said encoded digit pair in a second sub-interval following said first sub-interval.

5. Apparatus according to claim 4 wherein said encoding logic means includes means for generating each $a$ digit of an encoded digit pair according to the expression:

$$a_0 = \overline{d_0} \cdot \overline{b_{-1}} + d_0 \cdot d_{+1} \cdot \overline{d_{-1} \cdot a_{-1}} \cdot P(B);$$

and said encoding logic means further includes means for generating each $b$ digit of an encoded digit pair according to the expression:

$$b_0 = d_0 \cdot \overline{P(B)} + d_0 \cdot \overline{d_{+1}} \cdot \overline{d_{-1} \cdot a_{-1}}.$$

6. Apparatus according to claim 5 including means for initializing said third data digit storage means, said last encoded digit storage means and said parity function generator to zero.

7. Apparatus for encoding and decoding data in a (1,4) run length limited binary code, in which associated pairs ab of encoded digits, taking one of the value pairs 10, 01 and 00, correspond to individual data digits $d$, said apparatus consisting of encoding means and decoding means, said encoding means comprising:
    first data digit storage means for receiving the input data digits in sequence and for storing the next data digit $d_{+1}$ to be encoded;
    second data digit storage means for storing the current data digit $d_0$ to be encoded;
    third data digit storage means for storing the previously encoded data digit $d_{-1}$;
    last encoded digit storage means for storing the previous pair $a_{-1} b_{-1}$ of encoded digits;

condition indicating means for forming a cumulative function of previously encoded data digits to indicate which of a plurality of possible conditions said apparatus is in; and encoding logic means connected to said first, second and third data digit storage means, said last encoded digit storage means and said condition indicating means, said encoding logic means consisting of primary encoding logic means for encoding said data digits in a predetermined manner as one of said encoded digit pairs ab in dependence only upon the values $d_{-1}, a_{-1}, b_{-1}$, said condition indication and the value of the data digit $d_0$ to be encoded; and lookahead encoding logic means, responsive at least to one predetermined condition indication from said condition indicating means, for encoding a data digit $d_0$ of one value as one of said encoded digit pairs ab when said digit $d_{+1}$ has a first value and as another of said digit pairs ab when said digit $d_{+1}$ has the opposite value;

and said decoding means comprising:

first encoded digit storage means for receiving the encoded digits in sequence and for storing a pair of encoded digits $a_{+1}'$ and $b_{+1}'$ to be decoded;

second encoded digit storage means for storing a pair of encoded digits $a_0'$ and $b_0'$ to be decoded prior to $a_{+1}'$ and $b_{+1}'$;

third encoded digit storage means for storing an encoded digit $b_{-1}'$ of an encoded digit pair $a_{-1}' b_{-1}'$ decoded prior to $a_0'$ and $b_0'$; and decoding logic means connected to all three of said digit storage means for generating the data digit $d_0'$, corresponding to encoded digits $a_0' b_0'$, in dependence upon the value of the function $$(b_0' + \overline{a_{+1}'} \cdot \overline{b_{+1}'} + \overline{a_0'} \cdot \overline{b_{-1}'}).$$

8. Apparatus according to claim 7 wherein $$d_0' = (b_0' + \overline{a_{+1}'} \cdot \overline{b_{+1}'} + \overline{a_0'} \cdot \overline{b_{-1}'}).$$

* * * * *